(12) United States Patent
Wu et al.

(10) Patent No.: US 7,875,520 B2
(45) Date of Patent: Jan. 25, 2011

(54) METHOD OF FORMING CMOS TRANSISTOR

(75) Inventors: Meng-Yi Wu, Kaohsiung County (TW);
Cheng-Tung Huang, Kao-Hsiung (TW);
Wen-Han Hung, Kao-Hsiung (TW);
Shyh-Fann Ting, Tai-Nan (TW);
Kun-Hsien Lee, Tai-Nan (TW);
Li-Shian Jeng, Tai-Tung Hsien (TW);
Shih-Jung Tu, Tainan (TW); Yu-Ming Lin, Tainan County (TW); Yao-Chin Cheng, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 428 days.

(21) Appl. No.: 12/056,277

(22) Filed: Mar. 27, 2008

(65) Prior Publication Data

US 2009/0246922 A1    Oct. 1, 2009

(51) Int. Cl.
*H01L 21/336* (2006.01)
(52) U.S. Cl. .................. 438/300; 438/199; 438/301; 438/306
(58) Field of Classification Search .......... 438/199, 438/229, 230, 231, 232, 299, 300, 301, 303, 438/305, 306, 307
See application file for complete search history.

(56) References Cited

U.S. PATENT DOCUMENTS

| 5,719,425 | A  | * | 2/1998  | Akram et al. ............... 257/344 |
| 7,329,571 | B2 | * | 2/2008  | Hoentschel et al. ......... 438/199 |
| 2007/0020839 | A1 | * | 1/2007  | Sridhar et al. ............... 438/199 |
| 2007/0184600 | A1 | * | 8/2007  | Zhang et al. ................. 438/199 |
| 2007/0287244 | A1 | * | 12/2007 | Shen et al. ................... 438/199 |
| 2009/0023258 | A1 | * | 1/2009  | Liang et al. .................. 438/222 |

* cited by examiner

*Primary Examiner*—Kevin M Picardat
(74) *Attorney, Agent, or Firm*—Winston Hsu; Scott Margo

(57) ABSTRACT

A method of forming CMOS transistor is disclosed. A CMOS transistor having a first active area and a second active area is provided. In order to maintain the concentration of the dopants in the second active area, according to the method of the present invention an ion implantation process is performed to form a lightly doped drain (LDD) in the second active area after an epitaxial layer is formed in the first active area. On the other hand, the ion implantation process is performed to form the respective LDD of the first active area and the second active area. After the epitaxial layer in the first active area is formed, another ion implantation process is performed to implant dopants into the LDD of the second active area again.

17 Claims, 9 Drawing Sheets

METHOD OF FORMING CMOS TRANSISTOR

BACKGROUND OF THE INVENTION

1. Field of the Invention

The present invention is related to a method of forming a CMOS transistor.

2. Description of the Prior Art

The industrial circles are used to reducing device dimensions to improve the performance of metal-oxide semiconductor (MOS) transistors. However, this method encounters difficulties with high-expenses and technical bottlenecks in recent years. For these reasons, the industrial circles seek other methods to improve MOS transistor performance. And accordingly, a highly noticed method is to utilize the material characteristics to cause strain effect on MOS transistors.

In order to increase the driving current of a complementary metal-oxide semiconductor (CMOS) transistor including a p-type MOS (PMOS) transistor and an n-type MOS (NMOS) transistor, the industrial circles develop a strained-silicon technique, which uses unique processes or lattice constant discrepancy to increase driving current. The strained-silicon technique substantially includes a substrate-strained based method and a process-induced strain based method. The substrate-strained based system is performed with a strained-silicon substrate or a selective epitaxial growth process that results in lattice constant discrepancy. The process-induced strain based method is performed with several unique processes to form a strained thin film upon a surface of the MOS transistor that exert tensile stress or compressive stress upon the MOS transistor. Both of the strained-silicon techniques introduce strain into the channel region and reduce carrier mobile resistance thereby improving carrier mobility and MOS transistor performance.

During the fabrication processes for forming a CMOS transistor, a hard mask, such as a silicon nitride layer, is formed covering on the NMOS transistor or the PMOS transistor, and so that the exposed transistor is treated in the following process. Moreover, a phosphoric acid treatment is performed to remove the silicon nitride layer. However, a substrate loss occurs during the phosphoric treatment, and particularly to the substrate having high a concentration of dopants therein. Therefore, it is considerable to improve the conventional processes of the strained-silicon technique and to maintain the performance of the devices formed by the strained-silicon technique.

For the reasons above, the industry circles try to develop a method of strained-silicon technique to fabricate CMOS transistors and improve CMOS transistor reliability.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The primary objective of the present invention is to provide a method of forming a strained CMOS transistor to improve CMOS transistor performance and reliability and to overcome the drawback of conventional techniques. Initially, a semiconductor substrate having at least a first active area and at least a second active area is provided. The first active area and the second active area include a respective gate structure. A first light doped drain is formed beside the gate structure in the first active area. A sacrificial layer is formed on the semiconductor substrate. An etch process is performed to etch the sacrificial layer and a surface of the semiconductor substrate beside the gate structure in the first active area to form a recess on a surface of the semiconductor substrate beside the gate structure of the first active area. A selective epitaxial process is performed to form an epitaxial layer in the recess. After that, the sacrificial layer is removed, and a second light doped drain is formed beside gate structure in the second active area.

The light doped drain of the second active area is formed after the sacrificial layer is removed. Performing the method of the present invention is capable of preventing substrate dopant loss in the second active area of the semiconductor substrate during the process of removing the sacrificial layer. Therefore, the CMOS transistor formed by the method of the present invention has good working efficiency.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description, reference is made to the accompanying drawings, which form a part of this application. The drawings show, by way of illustration, specific embodiments in which the invention may be practiced. It is to be understood that other embodiments may be utilized and structural changes may be made without departing from the scope of the present invention.

Figure 1:
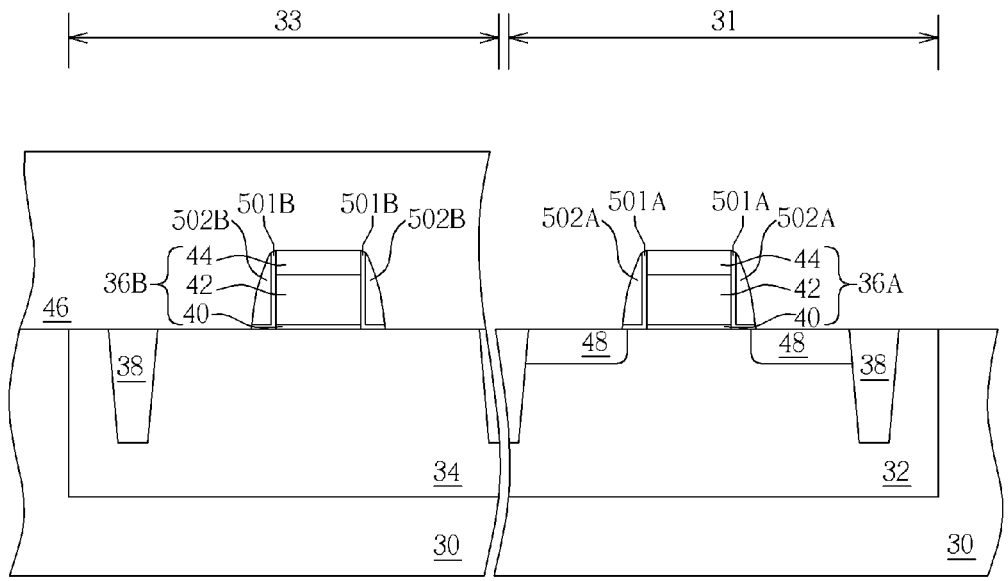
FIG. 1 to FIG. 7 are schematic diagrams illustrating a method of forming a CMOS transistor according to a first preferred embodiment of the present invention.

Please refer to FIG. 1 to FIG. 7, which are schematic diagrams illustrating a method of forming a CMOS transistor according to a first preferred embodiment of the present invention. Referring to FIG. 1, a semiconductor substrate 30 is provided. A plurality of first active area and a plurality of second active area are defined on the semiconductor substrate 30. Each of the first active area includes a first-type well and a gate structure, and each of the second active area includes a second-type well and a respective gate structure thereon. In the first preferred embodiment of the present invention, the first active area is a PMOS transistor region 31, and the second active area is an NMOS transistor region 33. Therefore, the first-type well is an N well, and the second-type well is a P well. The following diagrams shows a gate structure 36A and an N well 32 formed in the PMOS transistor region 31, and a gate structure 36B and a P well 34 in the NMOS transistor region 33 for illustration. A plurality of isolation structures between the MOS transistors to prevent short circuiting, such as shallow trench isolations 38 formed between the PMOS transistor region 31 and the NMOS transistor region 33. Each of the gate structure 36A, 36B includes a gate dielectric layer 40, a gate 42, and a cap layer 44. The gate dielectric layer 40 may comprise dielectric materials including silicon oxide, oxynitride, and silicon nitride; high-k dielectric materials including metal oxide, metal silicate, metal aluminate, and metal oxynitride; or combinations thereof. The gate dielectric layer 40 may be formed by a thermal oxidation process, a nitridation process, or a chemical vapor deposition (CVD) process. The gate 42 may use polysilicon, silicon germanium (SiGe), metal, silicide, metal nitride, metal oxide, or combinations thereof as material. The material of the cap layer 44 may include silicon oxide, oxynitride, silicon nitride, or silicon carbide (SiC). A thermal oxidation process is performed to form an oxide layer 501A, 501B on sidewalls of the gate structures 36A, 36B for protecting the gate structures 36A, 36B.

As shown in FIG. 1, a spacer formation process is optionally performed to form at least a first spacer 502A, 502B respectively beside the thermal oxide layers 501A, 501B. The preferred first spacers 502A, 502B may be a single-layered structure or a multi-layered structure. The preferred material of the first spacers 502A, 502B may use silicon oxide, silicon nitride, oxynitride, or other adoptable dielectric material. The first spacers 502A, 502B are formed by a plasma enhanced chemical vapor deposition (PECVD) process, a low-pressure chemical vapor deposition process (LPCVD), or other method for depositing the material layers of the first spacers 502A, 502B. Subsequently, an etch back process is performed to etch the material layers of the first spacers 502A, 502B. A first patterned photoresist 46 is formed on the gate structure 36B and a surface of the N well 32. A first ion implantation process is performed to implant dopants, such as boron (B) or fluoride boron ion ($BF_2+$), into a region of the N well 32 beside the gate structure 36A. Therefore, a p-type light doped drain (PLDD) 48 is formed in a region of the N well 32 beside the gate structure 36A. Furthermore, a rapid thermal process is optionally performed after the formation of the PLDD 48 for diffusing and activating the dopants therein.

Figure 2:
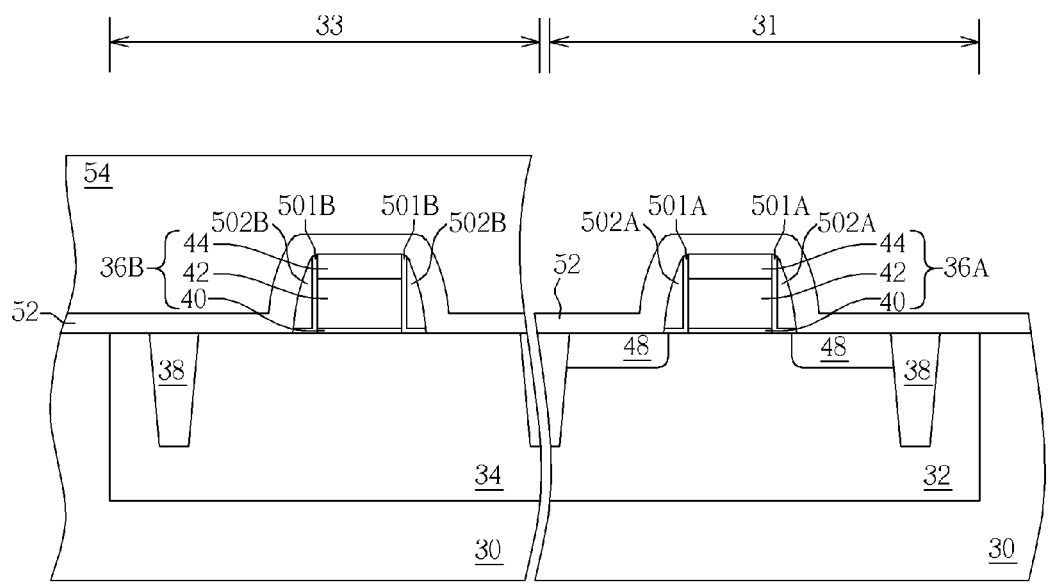

As shown in FIG. 2, the first patterned photoresist 46 is removed, and a sacrificial layer 52, such as a silicon nitride layer, is formed covering the semiconductor substrate 30. A second patterned photoresist 54 is formed covering gate structure 36B and the P well 34.

Figure 3:
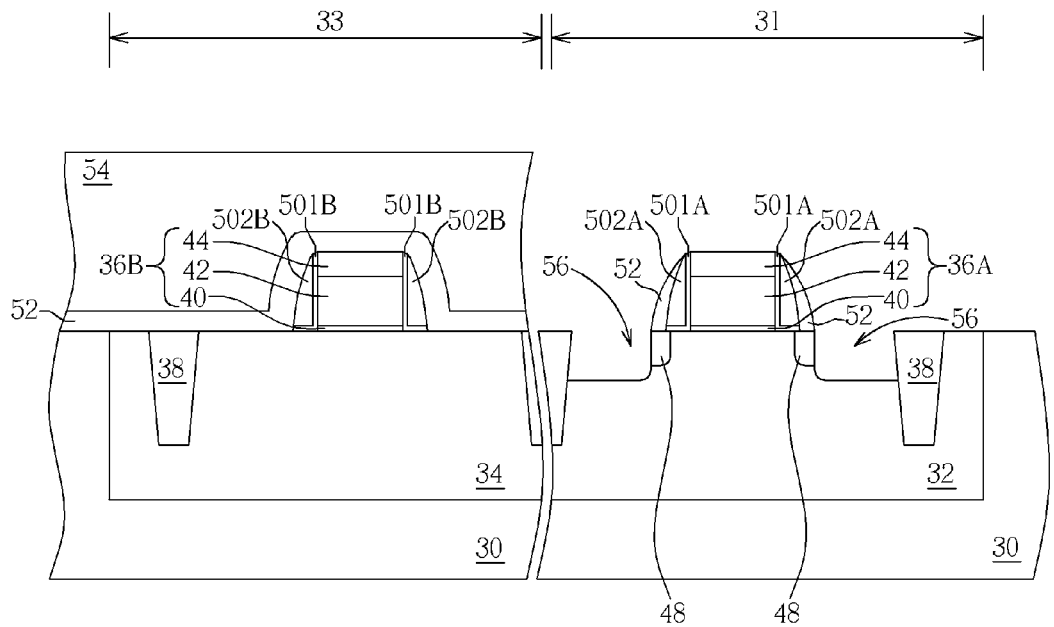

Please refer to FIG. 3, an etch process, i.e. an anisotropic etch process, is performed using the second patterned photoresist 54 as an etching mask to etch the sacrificial layer 52 and the semiconductor substrate 30, which are not covered by the second patterned photoresist 54. Therefore, a recess 56 is formed on the surface of the N well 32 beside the gate structure 36A.

Figure 4:
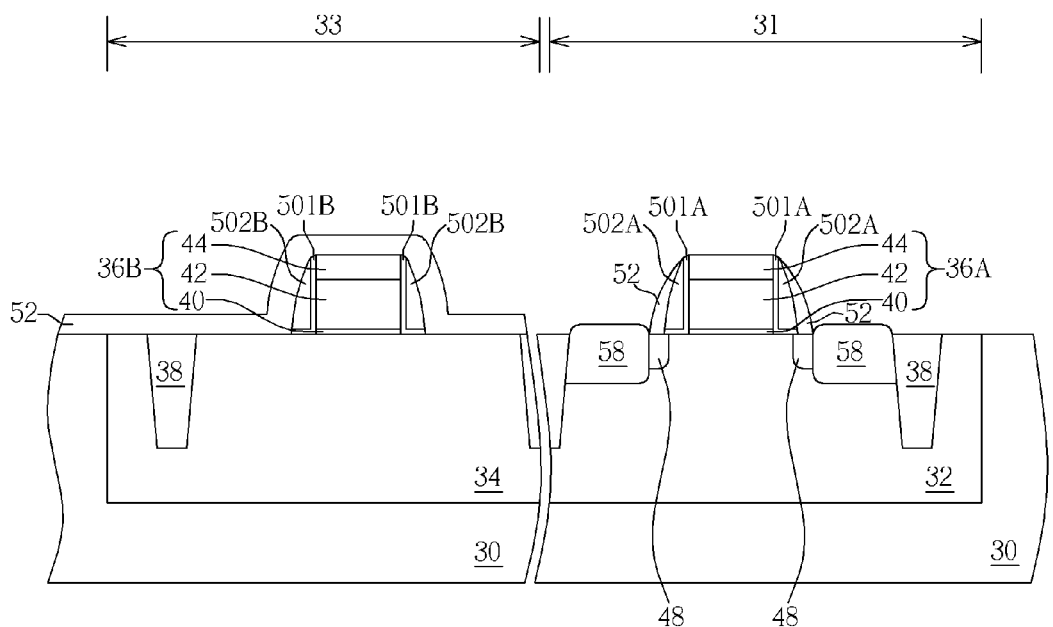

Please refer to FIG. 4 in company with FIG. 3. The second patterned photoresist 54 is removed. A selective epitaxial growth process is performed to form an epitaxial layer, such as an epitaxial layer 58 of silicon germanium. The preferred epitaxial layer 58 has a lattice constant greater than that of the semiconductor substrate 30, and is slightly extended approaching to the channel. Preferably, the epitaxial layer 58 is slightly projected from the top surface of the semiconductor substrate 30 to compress the channel and to keep silicon layers formed in the following steps from the interface between the source/drain in a distance. The top surface of the epitaxial layer 58 may be substantially leveled with or lower than the top surface of semiconductor substrate 30.

Figure 5:
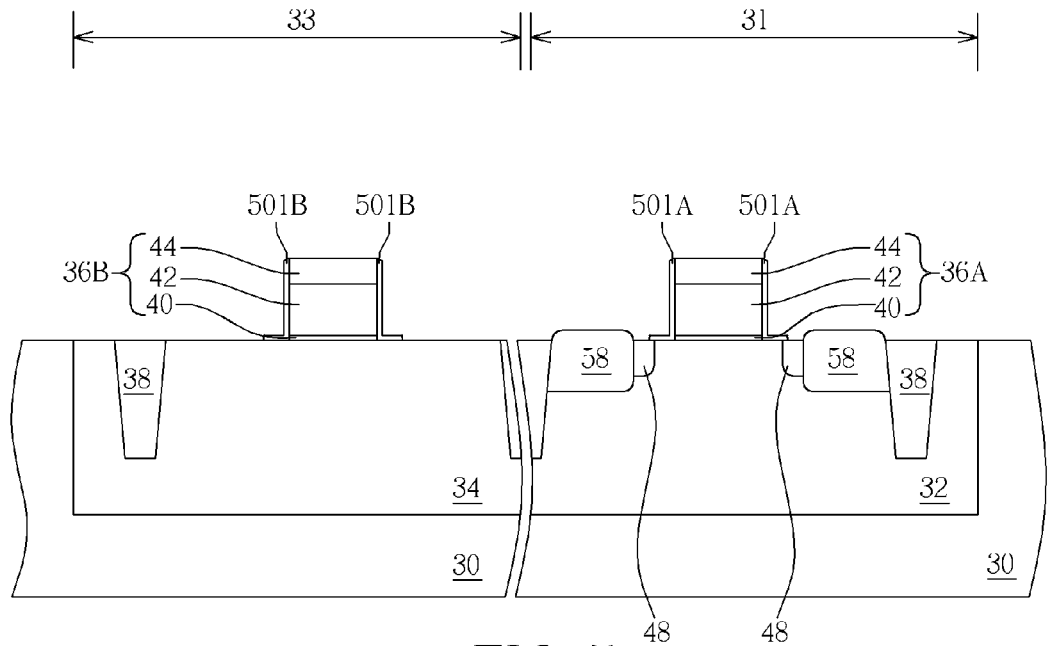

Please refer to FIG. 5, an etch process, preferably a phosphoric acid treatment, is performed to remove the sacrificial layer 52. Since the sacrificial layer 52 and the first spacers 502A, 502B of the first preferred embodiment substantially comprise silicon nitride, the sacrificial layer 52 and the first spacers 502A, 502B are simultaneously removed during the etch process.

Figure 6:
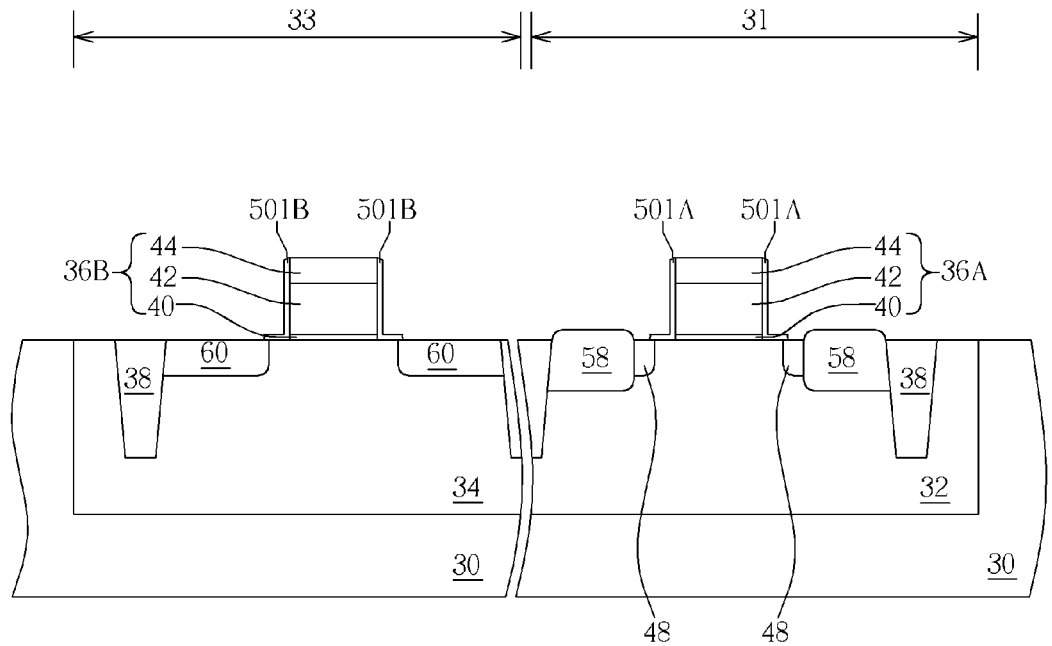

As shown in FIG. 6, a second ion implantation process is performed to form an n-type lightly doped drain (NLDD) 60 beside the gate structure 36B in the P well 34. The formation of the NLDD 60 may use the same fabrication processes as the first ion implantation shown in FIG. 1. For instance, a patterned photoresist (not shown) is formed to protect the N well 32 and the gate structure 36A in the PMOS transistor region 31. Then, the second ion implantation process is performed to implant dopants into the P well 34. In addition, a rapid thermal process is optionally performed after the formation of the NLDD 60 to activate the dopants.

Figure 7:
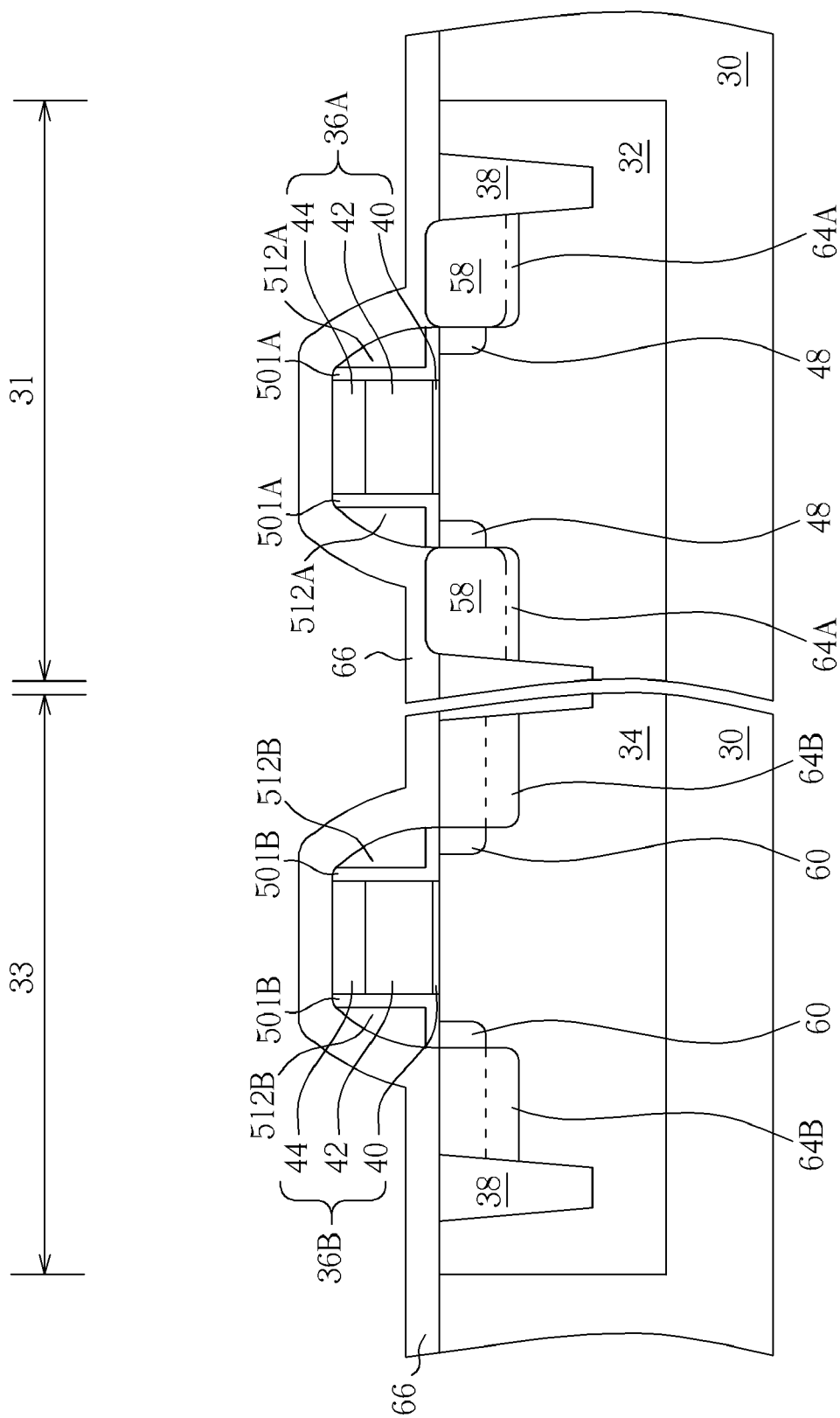

As shown in FIG. 7, at least a second spacer 512A, 512B is formed on the sidewalls of the gate structures 36A, 36B. The processes of forming the second spacers are the same as those processes for forming the first spacers 502A, 502B. A third implant process is performed to form a respective source/drain 64A in the PMOS transistor region 31, and a respective source/drain 64B in the NMOS transistor region 33. The processes of forming the source/drain 64A, 64B are well known, and will not be described in detail. In addition, a self-aligned silicide process (salicide process) is optionally performed. A metal layer, including titanium (Ti), cobalt (Co), nickel (Ni), palladium (Pd), platinum (Pt) or the like, is deposited. And a rapid thermal process is performed to form a silicide layer (not shown) on the surfaces of the source/drain 64A, 64B.

A deposition process is performed to form a contact etch stop layer (CESL) 66 on the surface of the gate structures 36A, 36B, the second spacers 512A, 512B, and the sources/drains 64A, 64B. The material of the CESL 66 may include a dielectric material or a strained silicon material, i.e. silicon nitride. Additionally, an inter-layer dielectric (ILD) layer (not shown) and a patterned photoresist (not shown) are formed, and an anisotropic etching process is performed using the patterned photoresist as an etching mask to form a plurality of contact holes (not shown) in the ILD layer and the CESL 66. The contact holes are the connections between the gate structures 36A, 36B or the sources/drains 64A, 64B with other electrical devices.

Figure 8:
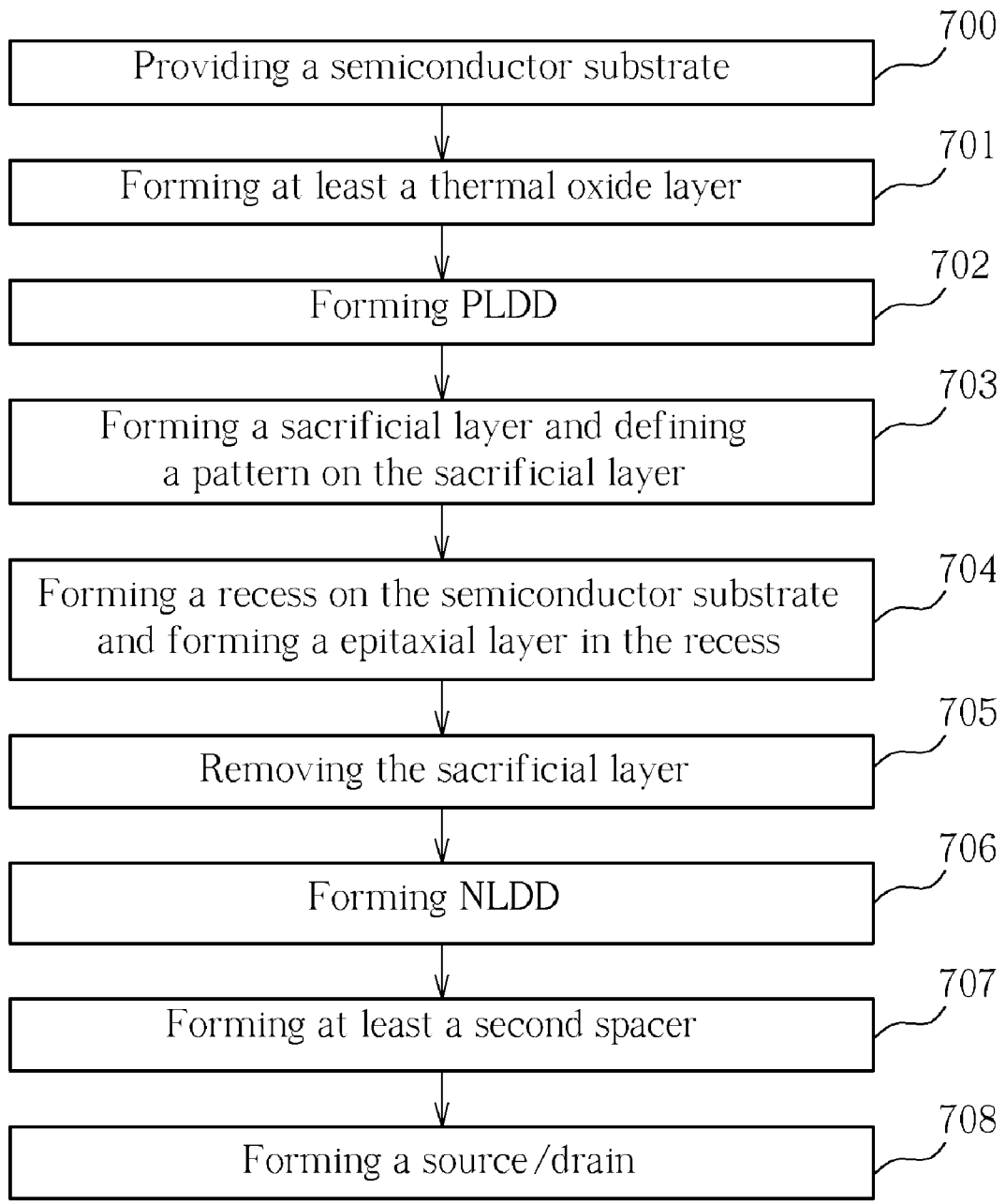
FIG. 8 is a flow diagram illustrating a method of forming a CMOS transistor in accordance with the first preferred embodiment of the present embodiment.

Please refer to FIG. 8, which shows a flow diagram illustrating a method of forming a CMOS transistor in accordance with the first preferred embodiment of the present embodiment. The steps of the first preferred embodiment are illustrated as follows:

Step 700: providing a semiconductor substrate having a PMOS transistor, a NMOS transistor, and a plurality of gate structures formed in the PMOS transistor and the NMOS transistor;

Step 701: forming at least a thermal oxide layer on the sidewalls of the gate structures;

Step 702: performing a first ion implantation process to form a PLDD in the semiconductor substrate beside the gate structures of the PMOS transistor;

Step 703: forming a sacrificial layer on the PMOS transistor and the NMOS transistor and patterning the sacrificial layer;

Step 704: using the patterned sacrificial layer as an etching mask, etching the semiconductor substrate in the PMOS transistor region, and forming an epitaxial layer in the recess, preferably an epitaxial layer of silicon germanium;

Step 705: removing the sacrificial layer;

Step 706: performing a second ion implantation process to form a NLDD in the semiconductor substrate beside the gate structure of the NMOS transistor;

Step 707: forming at least a second spacer on the sidewalls of the gate structures; and Step 708: performing a third ion implantation process to form a respective source/drain in the semiconductor substrate beside the gate structures of the NMOS transistor and the PMOS transistor.

Accordingly, the formation of the PMOS transistor and the NMOS transistor of a CMOS transistor is nearly finished. A silicide layer, a CESL, and an ILD layer, and contact holes for connecting the components of the CMOS transistor to or other electrical devices may be formed on the CMOS transistor to accomplish the CMOS transistor.

Moreover, the first preferred embodiment is illustrated using a PMOS transistor as the first active area, and an NMOS transistor as the second active area. In the contrast, the method of the first preferred embodiment can be modified to form a CMOS transistor having an NMOS transistor as the first active area, and a PMOS as the second active area. The first implantation process shown in FIG. 1 is performed to implant corresponding dopants, such as phosphorous (P) or other N-type dopants, into the semiconductor substrate to form a NLDD in the NMOS transistor. As shown in FIG. 4, the epitaxial layer of silicon carbide is formed. The second implantation process shown in FIG. 6 is performed to implant corresponding dopants, such as boron or other P-type dopants, into the semiconductor substrate to form a PLDD in the PMOS transistor. The following steps for forming the spacers and the source/drain in the PMOS transistors and the NMOS transistors are the same as those steps shown in the aforementioned first preferred embodiment.

Figure 9:
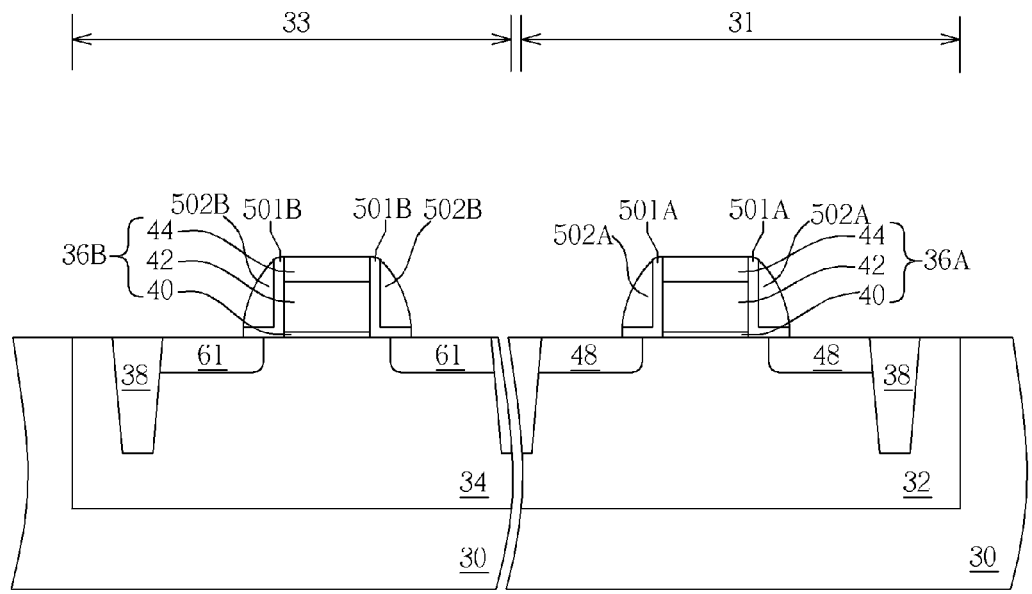
FIG. 9 to FIG. 14 are schematic diagrams illustrating a method of forming a CMOS transistor according to a second preferred embodiment of the present invention.

Please refer to FIG. 9 to FIG. 14, which are schematic diagrams illustrating a method of forming a CMOS transistor according to a second preferred embodiment of the present invention. Some elements are the same as those of the first preferred embodiment and are numbered as those of the first preferred embodiment. Referring to FIG. 9, a semiconductor substrate 30 is provided. A plurality of first active area and a plurality of second active area are defined on the semiconductor substrate 30. Each of the first active area includes a first-type well and a gate structure, and each of the second active area includes a second-type well and a respective gate structure thereon. In the second preferred embodiment of the present invention, the first active area is a PMOS transistor region 31, and the second active area is an NMOS transistor region 33. Therefore, the first-type well is an N well, and the second-type well is a P well. For the simplicity of description, a gate structure 36A and an N well 32 formed in the PMOS transistor region 31, and a gate structure 36B and a P well 34 in the NMOS transistor region 33 are shown in the diagram in the following.

As shown in FIG. 9, a thermal oxidation process to form a thermal oxide layer 501A, 501B respectively formed on the sidewalls of the gate structures 36A, 36B, and a spacer formation process is performed to form at least a first spacer 502A, 502B respectively formed beside the thermal oxide layers 501A, 501B. A first ion implantation process is performed to implant dopants, to form an NLDD1 61 in the NMOS transistor region 33 and a PLDD 48 in the P MOS transistor region 31. In addition, a rapid thermal process is optionally performed after the formation of the PLDD 48 in order to diffuse and to activate the dopants.

Figure 10:
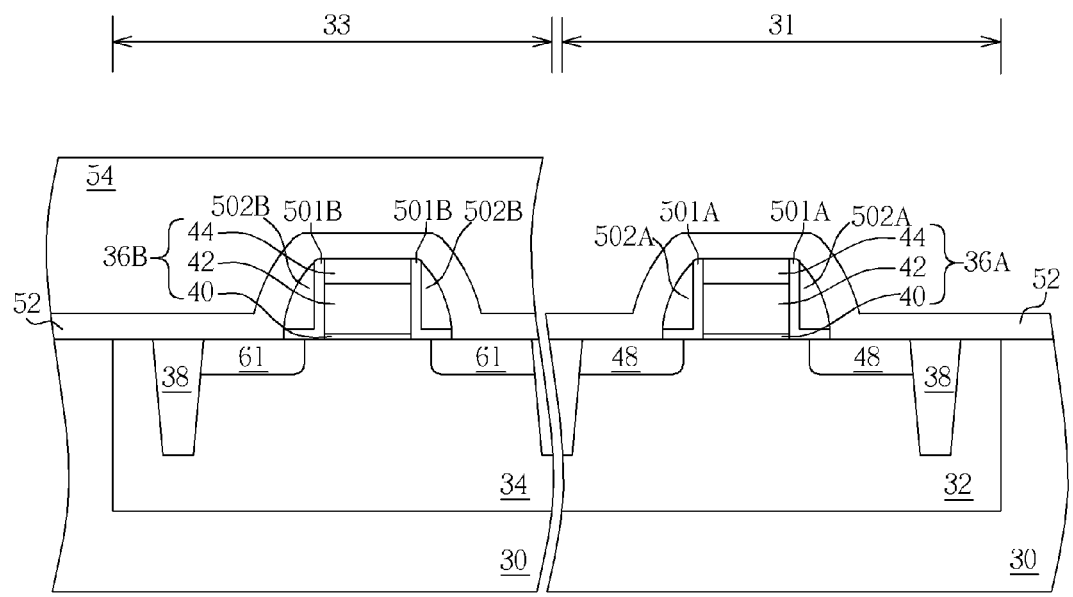

As shown in FIG. 10, a sacrificial layer 52, such as a silicon nitride layer, is formed covering the semiconductor substrate 30. A second patterned photoresist 54 is formed covering gate structure 36B and the P well 34. Please refer to FIG. 11, an etch process, such as an anisotropic etch process, is performed using the second patterned photoresist 54 as an etching mask to etch the sacrificial layer 52 and the semiconductor substrate 30 beside the gate structure 36A, which are not covered by the second patterned photoresist 54. Therefore, a recess 56 is formed on the surface of the N well 32 beside the gate structure 36A.

Figure 11:
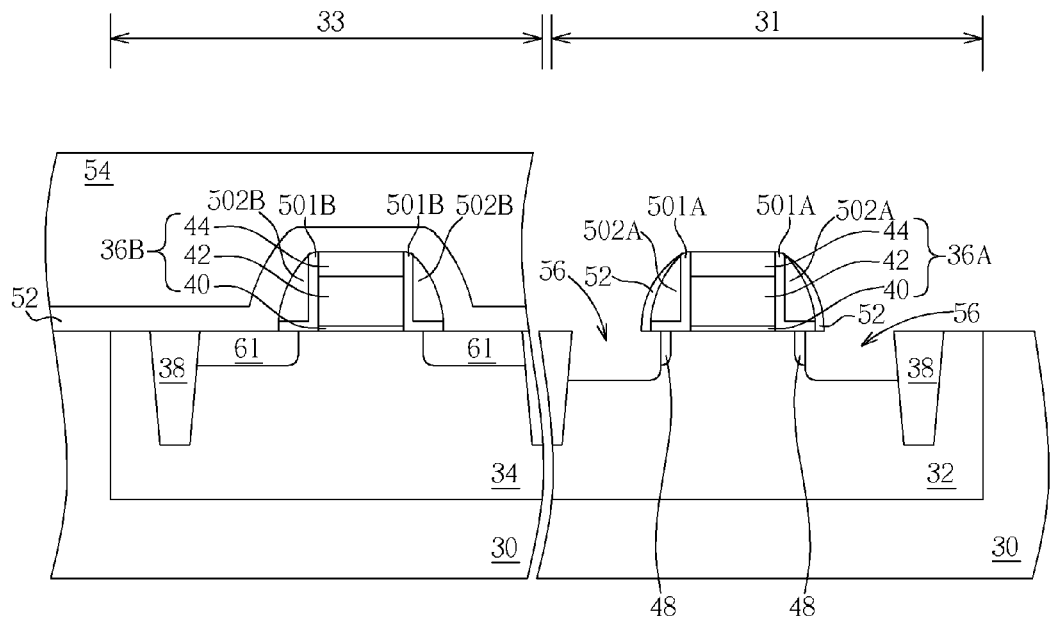
Figure 12:
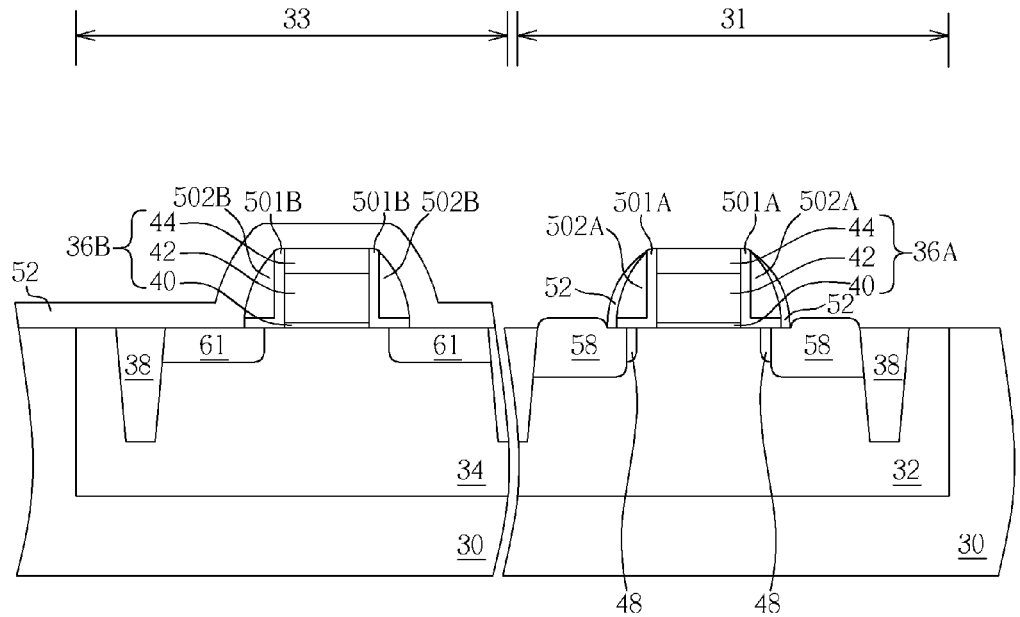

Please refer to FIG. 12 in company with FIG. 11. The second patterned photoresist 54 is removed. A selective epitaxial growth process is performed to form an epitaxial layer, such as an epitaxial layer 58 of silicon germanium. The preferred epitaxial layer 58 has a lattice constant greater than that of the semiconductor substrate 30, and is extended approaching to the channel. In order to compress the channel and to keep the silicon layer formed in the following steps from the interface between the source/drain in a distance, the preferred epitaxial layer 58 is slightly projected from the top surface of the semiconductor substrate 30. The top surface of the epitaxial layer 58 may be substantially leveled with or lower than the top surface of semiconductor substrate 30.

Figure 13:
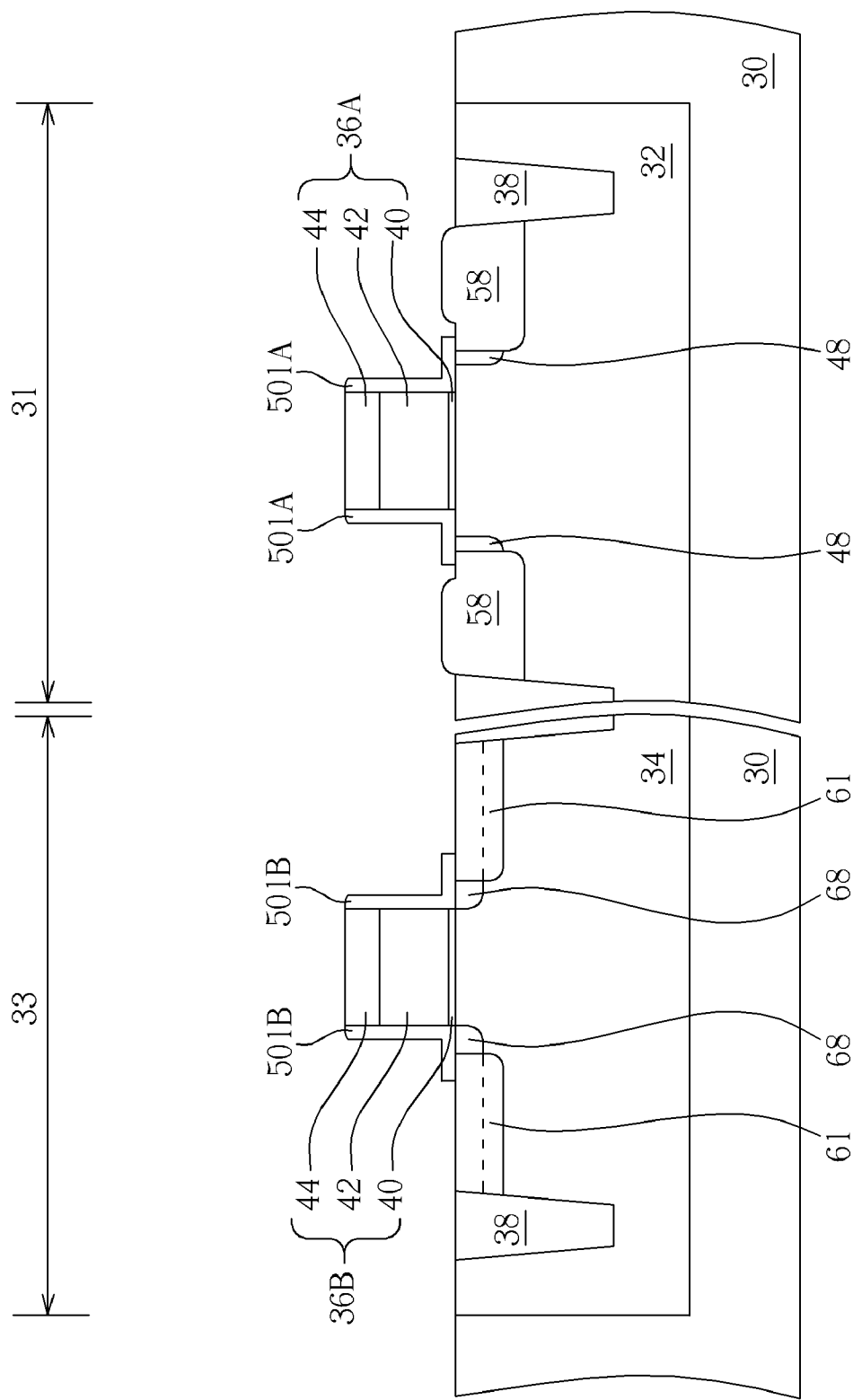

Please refer to FIG. 13, another etch process is performed, preferably a phosphoric acid treatment, to remove the sacrificial layer 52 and the first spacers 502A, 502B. In the present embodiment, the sacrificial layer 52 and the first spacers 502A, 502B are made of silicon nitride, and so that the sacrificial layer 52 and the first spacers 502A, 502B are removed by the phosphoric acid treatment simultaneously. A second ion implantation process is performed to form an NLDD2 68 in the P well 34 beside the gate structure 36B. The formation of the NLDD2 68 may use the same fabrication processes as the first ion implantation by means of forming a patterned photoresist formed to protect the N well 32 and the gate structure 36A in the PMOS transistor region 31. Then, the second ion implantation process is performed to implant dopants into the P well 34. In addition, a rapid thermal process is optionally performed after the formation of the NLDD2 68 for diffusing and activating the dopants.

Figure 14:
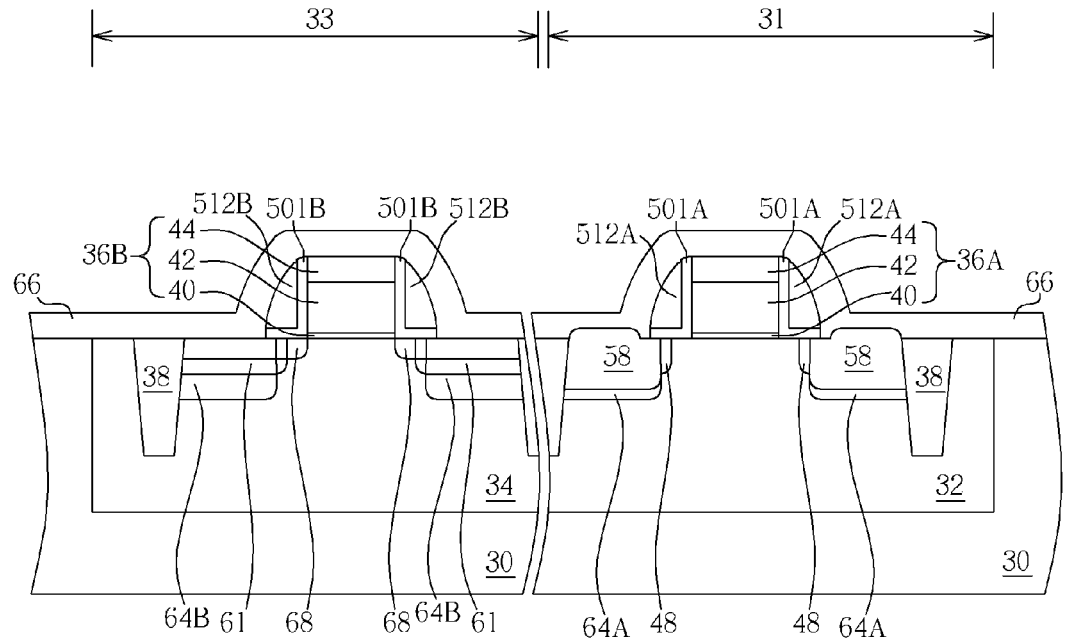

As shown in FIG. 14, at least a second spacer 512A, 512B is formed on the sidewalls of the gate structures 36A, 36B. A third implant process is performed to form a respective source/drain 64A in the PMOS transistor region 31, and a respective source drain 64B in the NMOS transistor region 33. In addition, a self-aligned silicide process is optionally performed to form a silicide layer (not shown) on the surfaces of the gate structures or the source/drain.

A deposition process is performed to form a CESL 66 on the surface of the gate structures 36A, 36B, the second spacers 512A, 512B, and the sources/drains 64A, 64B. Additionally, an ILD layer (not shown) and a patterned photoresist (not shown) are formed. An anisotropic etching process is performed using the patterned photoresist as an etching mask to form a plurality of contact holes (not shown) in the ILD layer and the CESL 66. The contact holes are acting as connectors between the gate structures 36A, 36B or the sources/drains 64A, 64B with other electrical devices.

Figure 15:
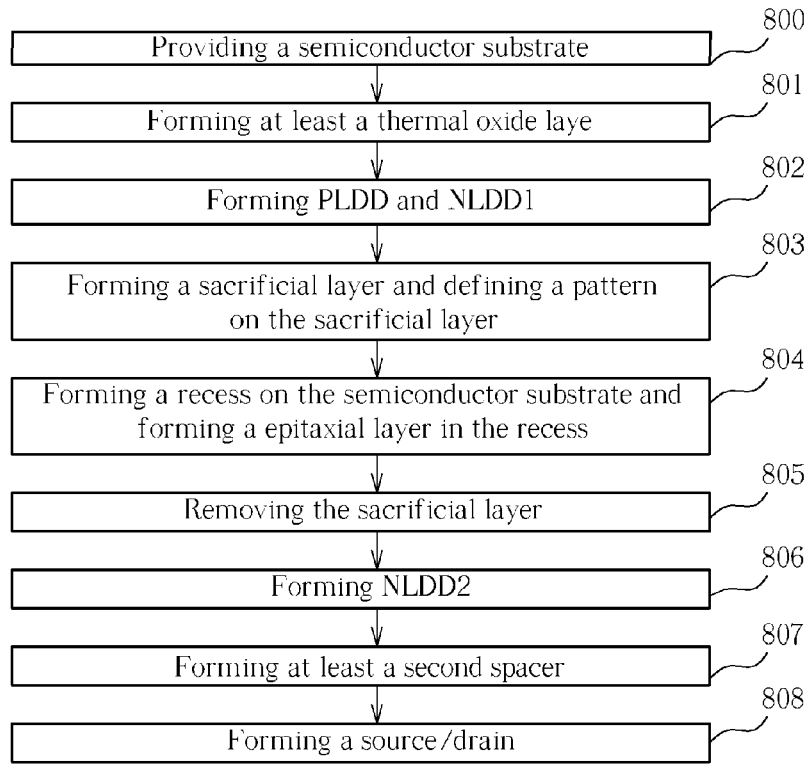
FIG. 15 is a flow diagram illustrating a method of forming a CMOS transistor in accordance with the second preferred embodiment of the present embodiment.

FIG. 15 is a flow diagram illustrating a method of forming a CMOS transistor in accordance with the second preferred embodiment of the present embodiment. The steps of the first preferred embodiment are illustrated as follows:

Step 800: providing a semiconductor substrate having a PMOS transistor, a NMOS transistor, and a plurality of gate structures formed in the PMOS transistor and the NMOS transistor;

Step 801: forming at least a thermal oxide layer on the sidewalls of the gate structures.

Step 802: performing a first ion implantation process to form a PLDD in the semiconductor substrate beside the gate structures of the PMOS transistor, and an NLDD1 in the semiconductor substrate beside the gate structures of the NMOS transistor;

Step 803: forming a sacrificial layer and patterning the sacrificial layer;

Step 804: using the patterned sacrificial layer as an etching mask, etching the semiconductor substrate beside the gate structure in the PMOS transistor region, and forming an epitaxial layer in the recess, i.e. an epitaxial layer of silicon germanium;

Step 805: removing the sacrificial layer;

Step 806: performing a second ion implantation process to form an NLDD2 in the semiconductor substrate beside the gate structure of the NMOS transistor;

Step 807: forming at least a second spacer on the sidewalls of the gate structures; and Step 808: performing a third ion implantation process to form a respective source/drain in the semiconductor substrate beside the gate structures of the NMOS transistor and the PMOS transistor.

Accordingly, the formation of the PMOS transistor and the NMOS transistor of a CMOS transistor is nearly finished. A silicide layer, a CESL, and an ILD layer, and contact holes for connecting the components of the CMOS transistor to or other electrical devices may be formed on the CMOS transistor to accomplish the CMOS transistor.

In contrast to the first preferred embodiment, the second preferred embodiment forms the NLDD1 and the PLDD prior to the formation of the recess in the PMOS transistor region. After the epitaxial layer of silicon germanium is formed, the step of removing the sacrificial layer by a phosphoric acid treatment. A part of the heavily doped regions positioned nearby of the semiconductor substrate, such as NLDD1, is probably lost during the step of removing the sacrificial layer. To compensate dopant loss of the silicon substrate, a second ion implantation process of the second preferred embodiment is successively performed to implant the corresponding dopants into the substrate, and so that the performance of the second ion implantation processes may compensate the dopant loss during the step of removing the sacrificial layer and to maintain the concentration of the dopants.

Moreover, the first preferred embodiment is illustrated using a PMOS transistor as the first active area, and an NMOS transistor as the second active area. In the contrast, the method of the first preferred embodiment can be modified to form a CMOS transistor having an NMOS transistor as the first active area, and a PMOS as the second active area. The first implantation process shown in FIG. 9 is performed to implant corresponding dopants, such as boron or other P-type dopants, into the semiconductor substrate to form the PLDD1 in the PMOS transistor. As shown in FIG. 12, the epitaxial layer of silicon carbide is formed. The second implantation process shown in FIG. 14 is performed to implant P-type dopants, into the semiconductor substrate to form a PLDD2 in the PMOS transistor. The following steps of forming the spacers and the source/drain in the PMOS transistors and the NMOS transistors are the same as those steps shown in the aforementioned first preferred embodiment.

As described above, the method of the present invention is discloses to overcome dopant loss of the semiconductor substrate nearby the surface thereof, wherein the dopant loss is resulted by a phosphoric acid treatment for removing the sacrificial layer. As shown in the first preferred embodiment, the sequence of forming the light doped drain is modified by means of forming the NLDD in the NMOS transistor subsequent to the steps of removing the sacrificial layer and the formation of the epitaxial layer. On the other hand, according to the second preferred embodiment of the present invention, the steps of forming the NLDD1 and PLDD, including removing the sacrificial layer, and forming of the epitaxial layer, are performed. After that, another ion implantation process is performed to form the NLDD2 in the NMOS region to compensate the dopant loss nearby the surface of the NMOS transistor. Furthermore, the preferred embodiments of the present invention forms spacers prior to the implantation process for forming the light doped drain. On the other hand, the implantation process for forming the light doped drain in the semiconductor substrate may be performed without forming any spacers on the sidewalls of the gate structures.

Those skilled in the art will readily observe that numerous modifications and alterations of the device and method may be made while retaining the teachings of the invention.

What is claimed is:

1. A method of forming a CMOS transistor, comprising:
providing a semiconductor substrate having at least a first active area, at least a second active area, and a respective gate structure formed in the first active area and the second active area;
forming a first light doped drain beside the gate structure of the first active area;
forming a sacrificial layer on the semiconductor substrate;
performing an etch process to etch the sacrificial layer formed in the first active area and a surface of the semiconductor substrate beside the gate structure of the first active area and to form at least a recess beside the gate structure of the first active area;
performing a selective epitaxial growth process to form an epitaxial layer in the recess;
removing the sacrificial layer; and
forming a second light doped drain beside the gate structure of the second active area after the sacrificial layer is removed.

2. The method of claim 1, wherein at least a first spacer is formed on a respective sidewall of the gate structures after the first light doped drain is formed.

3. The method of claim 2, wherein the first space comprises silicon oxide, silicon nitride, or combinations thereof.

4. The method of claim 2, wherein at least a second spacer is formed on a respective sidewall of the gate structures after the second light doped drain is formed.

5. The method of claim 4, wherein a respective source/drain is formed in the first active area and the second active area.

6. The method of claim 1, wherein the first active area comprises a PMOS transistor region, the second active area comprise an NMOS transistor region, and the epitaxial layer comprises silicon germanium.

7. The method of claim 1, wherein the first active area comprises an NMOS transistor region, the second active area comprises a PMOS transistor region, and the epitaxial layer comprises silicon carbide.

8. The method of claim 1, wherein a rapid thermal process is performed subsequent to the formation of the first light doped drain, or the formation of the second light doped region.

9. The method of claim 1, wherein the sacrificial layer comprises silicon oxide or silicon nitride.

10. A method of forming a CMOS transistor, comprising:
providing a semiconductor substrate having at least a first active area, at least a second active area, and a respective gate structure formed in the first active area and the second active area;
forming a first light doped drain beside the gate structure of the first active area and a second light doped drain beside the gate structure of the second active area;
forming a sacrificial layer on the semiconductor substrate;
performing an etch process to etch the sacrificial layer formed in the first active area and a surface of the semiconductor substrate beside the gate structure of the first active area and to form at least a recess beside the gate structure of the first active area;
performing a selective epitaxial growth process to form an epitaxial layer in the recess;
removing the sacrificial layer;
forming a third light doped drain beside the gate structures of the second active area; and
forming a respective source/drain in the first active area and the second active area.

11. The method of claim 10, wherein at least a first spacer is formed on a respective sidewall of the gate structures after the first light doped drain is formed.

12. The method of claim 11, wherein the first space comprises silicon oxide, silicon nitride, or combinations thereof.

13. The method of claim 11, wherein at least a second spacer is formed on a respective sidewall of the gate structures after the third light doped drain is formed.

14. The method of claim 10, wherein the first active area comprises a PMOS transistor region, the second active area comprises an NMOS transistor region, and the epitaxial layer comprises silicon germanium.

15. The method of claim 10, wherein the first active area comprises an NMOS transistor region, the second active area comprises a PMOS transistor region, and the epitaxial layer comprises silicon carbide.

16. The method of claim 10, wherein a rapid thermal process is performed subsequent to the formation of the first light doped drain, the formation of the second light doped region, or the formation of the third light doped region.

17. The method of claim 10, wherein the sacrificial layer comprises silicon oxide or silicon nitride.

* * * * *